(12) United States Patent
Nishioka et al.

(10) Patent No.: US 7,411,852 B2
(45) Date of Patent: Aug. 12, 2008

(54) SEMICONDUCTOR MEMORY DEVICE AND METHOD OF ADJUSTING SAME

(75) Inventors: Naohisa Nishioka, Tokyo (JP); Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/585,948

(22) Filed: Oct. 25, 2006

(65) Prior Publication Data

US 2007/0097773 A1    May 3, 2007

(30) Foreign Application Priority Data

Oct. 27, 2005   (JP)   ............... 2005-313387

(51) Int. Cl.
  *G11C 17/18*   (2006.01)
(52) U.S. Cl. ............................ 365/225.7; 365/189.05; 365/194

(58) Field of Classification Search .............. 365/225.7, 365/189.05, 194, 233, 230.08; 327/152–159
See application file for complete search history.

(56) References Cited

U.S. PATENT DOCUMENTS

| | | | | |
|---|---|---|---|---|
| 6,426,900 | B1 * | 7/2002 | Maruyama et al. | 365/194 |
| 6,490,224 | B2 * | 12/2002 | Manning | 365/233 |
| 6,552,587 | B2 * | 4/2003 | Kim et al. | 327/158 |
| 7,106,099 | B1 * | 9/2006 | Nix | 326/40 |
| 7,111,185 | B2 * | 9/2006 | Gomm et al. | 713/401 |

\* cited by examiner

*Primary Examiner*—Gene N. Auduong
(74) *Attorney, Agent, or Firm*—Young & Thompson

(57) ABSTRACT

A DLL Reset signal for delivering Fuse data from anti-fuses is generated from a reset signal which is supplied asynchronous to a clock when an initial setting is made. The DLL Reset signal is supplied to an anti-fuse block which comprises a plurality of anti-fuses, such that the delay amount of an internal signal is switched to a desired value in accordance with the Fuse data written into the anti-fuses.

12 Claims, 9 Drawing Sheets

SEMICONDUCTOR MEMORY DEVICE AND METHOD OF ADJUSTING SAME

BACKGROUND OF THE INVENTION

This application is based upon and claims the benefit of priority from Japanese Patent Application No. 2005-313387 filed on Oct. 27, 2005, the content of which is incorporated by reference.

1. Field of the Invention

The present invention relates to a semiconductor memory device which is configured to adjust the delay amount of an internal signal using data written into anti-fuses.

2. Description of the Related Art

Recent information processing apparatuses and the like are bottlenecked on access speeds to semiconductor memory devices, which limit system processing speeds, as a result of an increase in processing speeds performed by CPU. Thus, there is demand for a reduction in the time required to write and read data into and from semiconductor memory devices, and has been addressed by using DRAM (Dynamic Random Access Memory), SDRAM (Synchronous DRAM) and the like which operate at clock speeds at several hundred MHz. Further, developments are now in progress for DDR (Double Data Rate) 3-SDRAM which operates even at clock period tCK on the order of 1.25 to 2.5 ns.

In such semiconductor memory devices which operate at such high-speed clocks, a strict requirement is imposed on a Setup/Hold time (hereinafter called the "tIS/tIH") of an internal signal to the clock. For example, DDR3-SDRAM is required to have a specified value of tIS/tIH in a range of 100-200 ps.

However, it is difficult to restrict tIS/tIH of all products within the specified range of values mentioned above when taking into account variations in manufacturing. As such, in order to improve the manufacturing yield rate, an adjusting operation is required for adjusting the delay amount of an internal signal to restrict tIS/tIH within a specified range of values (hereinafter called the "timing adjustment" in some cases).

Anti-fuses have been conventionally used for adjusting the timing of internal signals. The anti-fuse is a fuse element which records information (Fuse data) by producing an electrical breakdown therein. In semiconductor memory devices, Fuse data written into anti-fuses are read by a predetermined command signal, for example, upon power-on, and the delay amount of an internal signal is changed in accordance with the read Fuse data, thereby setting the tIS/tIH to fall within a specified range of values.

This adjustment of a delay time for an internal signal can be accomplished by supplying Fuse data AF[n:0] to a delay switching circuit, for example, as illustrated in FIG. 1, and controlling ON/OFF of a plurality of adjusting transistors, which make up the delay switching circuit, in response to Fuse data AF[n:0].

The delay switching circuit illustrated in FIG. 1 comprises a driver circuit made up of a P-channel MOS transistor and an N-channel MOS transistor which have their drains connected to each other; a plurality of adjusting P-channel MOS transistors connected in parallel for supplying a source voltage to the P-channel MOS transistor of the driver circuit, and a plurality of adjusting N-channel MOS transistors connected in parallel for supplying a ground potential to the N-channel MOS transistor of the driver circuit. Fuse data AF[n:0] read from an anti-fuse is supplied to the plurality of adjusting P-channel MOS transistors and the plurality of adjusting N-channel MOS transistors, connected in parallel, for use in controlling ON/OFF of the respective MOS transistors.

In such a circuit, an applied internal signal (CMDB signal) can be delayed by a desired amount before it is delivered in accordance with the number of adjusting P-channel MOS transistors and adjusting N-channel MOS transistors which operate together with the driver circuit.

For example, as reference data, n/2 Fuse data AF[*] are set to High (ON), and the remaining n/2 Fuse data AF[*] are set to Low (OFF)—as will be later described, each anti-fuse can be arbitrarily set to "0" or "1" before any data is written, and the set "0" or "1" can be inverted by writing appropriate data into the anti-fuse. Then, based on the reference data, when the internal signal (CMDB signal) is generated from an MRS CMD signal for initial setting delays in rising/falling, an adjusting P-channel MOS transistor (or adjusting N-channel MOS transistor) set to OFF is switched to ON by Fuse data to increase the driving ability to reduce the delay amount. On the other hand, when the internal signal (CMDB signal) is too early in rising/falling, a larger number of adjusting P-channel MOS transistors (or adjusting N-channel MOS transistors) are set to OFF to increase the delay amount.

Here, all the transistors that are described have the same size, but the number of anti-fuses can be reduced by changing the size of each transistor in proportion to the second power. By thus using the anti-fuses, tIS/tIH of the semiconductor memory device can be restricted within the specified range of values.

In this connection, anti-fuses are also used for remedying defective memory cells, in addition to timing adjustment for internal signals. In a semiconductor memory device, Fuse data written into anti-fuses when initially set are read to perform operations in accordance with the read Fuse data. The Fuse data for adjusting the timing of an internal signal are read by a Fuse read signal which is generated on the basis of an MRS CMD (Mode Register Set Command) supplied when an initial setting is made.

As illustrated in FIG. 2, a conventional anti-fuse control circuit comprises anti-fuse block 1, delay switching circuit 2, latch circuit 4, and Fuse read signal generator circuit 5.

Anti-fuse block 1 comprises a plurality of anti-fuses which record Fuse data, and supplies recorded Fuse data to delay switching circuit 2.

Delay switching circuit 2 switches the delay amount of an internal signal (CMDB signal) generated, for example, from the MRS CMD signal in accordance with the Fuse data supplied from anti-fuse block 1. Delay switching circuit 2 uses the circuit illustrated in FIG. 1.

Latch circuit 4 senses the CMDB signal generated from delay switching circuit 2 to generate a command (PMDC-MDT) signal in synchronization with clock CLK.

Fuse read signal generator circuit 5 delivers the PMDC-MDT signal supplied from latch circuit 4 as a Fuse read signal in accordance with a PMRS signal and an ADD2 signal.

When a delay amount of an internal signal is adjusted using anti-fuses, "0" is delivered when the anti-fuse is not written, while "1" is delivered when the anti-fuse is written on the assumption that the output signal of latch circuit 4 is delivered as is. On the other hand, if the output signal of latch circuit 4 is inverted before it is delivered, "1" is provided when the anti-fuse is not written, while "0" is provided when the anti-fuse is written, from which it is understood that the aforementioned adjusting P-channel MOS transistors and adjusting N-channel MOS transistors contained in delay switching circuit 2 can be arbitrarily set to ON/OFF.

The CMDB signal is generated from the MRS CMD signal which is generated in accordance with a variety of input signals of the semiconductor memory device when an initial setting is made. The PMRS signal and ADD2 signal are code signals which are generated in accordance with a variety of input signals of the semiconductor memory device when an initial setting is made for use as gate signals to deliver the Fuse read signal.

The Fuse read signal generated from Fuse read signal generator circuit 5 is supplied to anti-fuse block 1 which comprises a plurality of anti-fuses. Upon receipt of the Fuse read signal, anti-fuse block 1 delivers Fuse data that is recorded in the anti-fuses.

As represented in FIG. 3, latch circuit 4 senses the CMDB signal delivered from delay switching circuit 2, after the delay amount has been adjusted, and generates a command signal (PMDCMDT signal) required to read Fuse data from anti-fuse block 1. In this event, in order for latch circuit 4 to sense the CMDB signal, it is necessary to ensure a Setup time (tIS) which extends from the falling of the CMDB signal to the rising edge of clock CLK, and a Hold time (tIH) which extends from a rising edge of clock CLK to a rising edge of the CMDB signal, as mentioned above.

The PMDCMDT signal generated from latch circuit 4 is delivered as the Fuse read signal from Fuse read signal generator circuit 5 when the PMRS signal and ADD2 signals are both at "High."

As illustrated in FIG. 4, anti-fuse block 1 comprises reset holder circuit 11 for holding the Fuse read signal, anti-fuse unit 12 for recording Fuse data, and fuse decode counter 13 for decoding information supplied from anti-fuse unit 12 to deliver Fuse data AF[n:0].

As illustrated in FIG. 5, anti-fuse block 1 is enabled to accept the Fuse read signal in response to an FFRST signal applied to reset holder circuit 11. Upon application of the Fuse read signal, reset holder circuit 11 holds the Fuse read signal, and generates an AFLOAD signal for supplying the Fuse data to anti-fuse unit 12.

Anti-fuse unit 12 comprises a plurality of storage elements, each of which is made up of a P-channel MOS transistor and N-channel MOS transistor which have their drains connected to each other with a fuse element interposed therebetween, where each storage element generates a "High" or a "Low" signal in accordance with the state (cut or uncut) of the fuse element. The signal delivered from each storage element is decoded by fuse decode counter 13 and then delivered as Fuse data AF[n:0].

Except in cases that involve different timing signal for delivering Fuse data AF[n:0], Anti-fuse block 1 may employ a circuit similar to a known anti-fuse block for use in remedying defective memory cells, and is not therefore limited to the circuit illustrated in FIG. 4.

For initial settings of semiconductor memory devices such as DRAM, semiconductor memory device has been conventionally operated in many cases by using a Power-On (hereinafter called "PON") signal that is generated upon turning on the power or by a command (MRS CMD) signal when an initial setting is made. However, these signals are indefinite and therefore may sometimes cause a failure during the initial settings. For example, the PON signal may not be generated depending on a voltage value, its slope (Slew Rate) and the like when the semiconductor memory device is powered on by a system. Also, in a configuration where command signals are internally generated for initial settings, a shift in tIS/tIH of CLK and CMD, if any, can cause a failure to generate a command signal under strict tIS/tIH conditions at high operating frequencies. Stated conversely, a command signal can be always generated by adjusting the timing, but before the adjustment, there is no guarantee that the command signal will always be generated because how the delay amount of internal signal will be set when an initial setting is made is not known. Accordingly, future semiconductor memory devices, which are required to operate at higher frequencies, will encounter difficulties in ensuring secure operations because of these indefinite factors.

In the conventional anti-fuse control circuit described above, Fuse data are delivered from the anti-fuse block in response to the Fuse read signal generated when an initial setting is made. For this reason, if clock CLK and CMDB signal shift in phase relationship when an initial setting is made as shown in FIG. 6, this shift can cause tIS/tIH to fall out of the specified range of values, resulting in a failure to generate the PMDCMDT signal from the latch circuit and a consequent failure to generate the Fuse read signal.

In this event, since Fuse data are not delivered from the anti-fuse block, the delay amount of the CMDB signal is not switched in the delay amount switching circuit, thus impeding normal operation of the semiconductor device.

Also, a failure to generate Fuse read signal would disable an adjustment test for writing Fuse data into anti-fuses (the aforementioned adjustment of the timing for an internal signal), which is performed after assembly of the semiconductor memory device.

In future semiconductor memory devices, in particular, which are expected to operate at increasingly higher clock frequencies, increasingly more strict restrictions will be imposed on the aforementioned tIS/tIH, thus making it more difficult to guarantee normal operation of the semiconductor memory device due to the indefinite factors as mentioned above.

SUMMARY OF THE INVENTION

It is therefore an object of the present invention to provide a semiconductor memory device which is capable of always retrieving data written into anti-fuses, and which is capable of adjusting the timing of an internal signal when an initial setting is made, and to provide a method of adjusting the same.

To achieve the above object, in the present invention, a DLL Reset signal for delivering Fuse data from anti-fuses is generated using a reset signal which is supplied asynchronously to a clock when an initial setting is made. Thus, the DLL Reset signal is always generated even at high clock frequencies, ensuring the delivery of Fuse data written into the anti-fuses.

Accordingly, a delay amount of an internal signal can always be switched to a desired value in accordance with Fuse data written into the anti-fuses, so that a command signal is always generated from a latch circuit. It is therefore possible to always conduct, an adjustment test for writing Fuse data into anti-fuses (for adjusting the timing of the internal signal), after assembly of the semiconductor.

Also, even in future semiconductor memory devices which are expected to operate at increasingly higher clock frequencies, since the Fuse data written into the anti-fuses is always delivered. Therefore, it is possible to obtain a semiconductor memory device that meets a specified value of tIS/tIH of the internal signal to the clock. Consequently, the manufacturing yield rate of semiconductor memory devices is improved.

The above and other objects, features, and advantages of the present invention will become apparent from the following description with reference to the accompanying drawings, which illustrate examples of the present invention.

DETAILED DESCRIPTION OF THE PREFERRED EMBODIMENT

Figure 1:
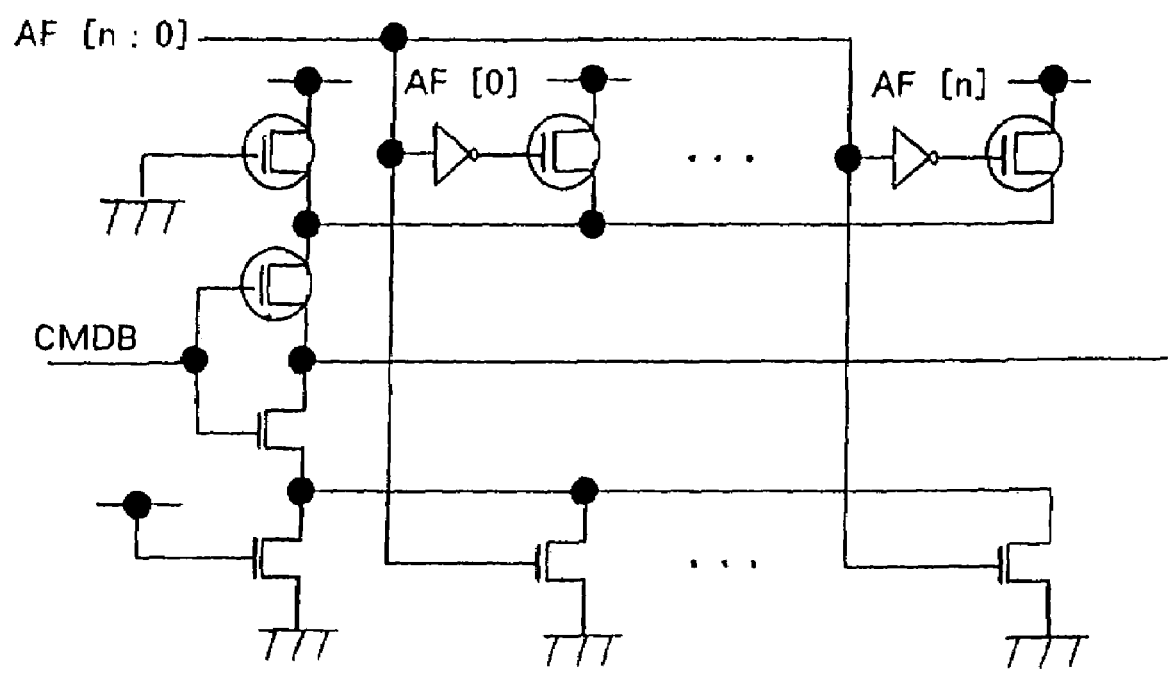
FIG. 1 is a circuit diagram illustrating an exemplary configuration of a delay switching circuit used to adjust the delay amount of an internal signal.
Figure 2:
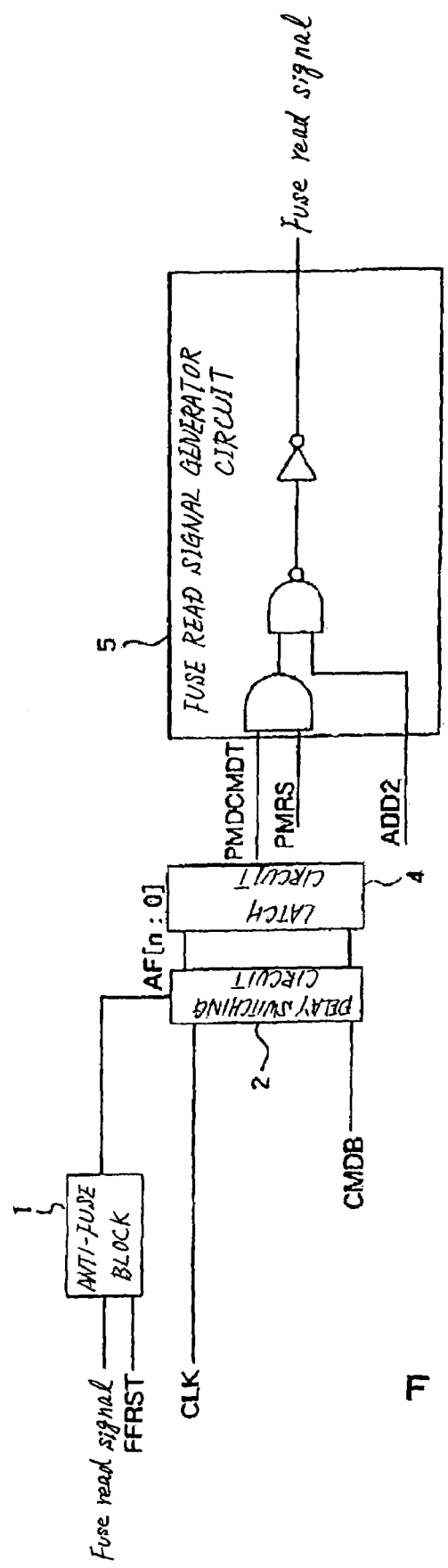
FIG. 2 is a block diagram illustrating the configuration of a conventional anti-fuse control circuit.
Figure 3:
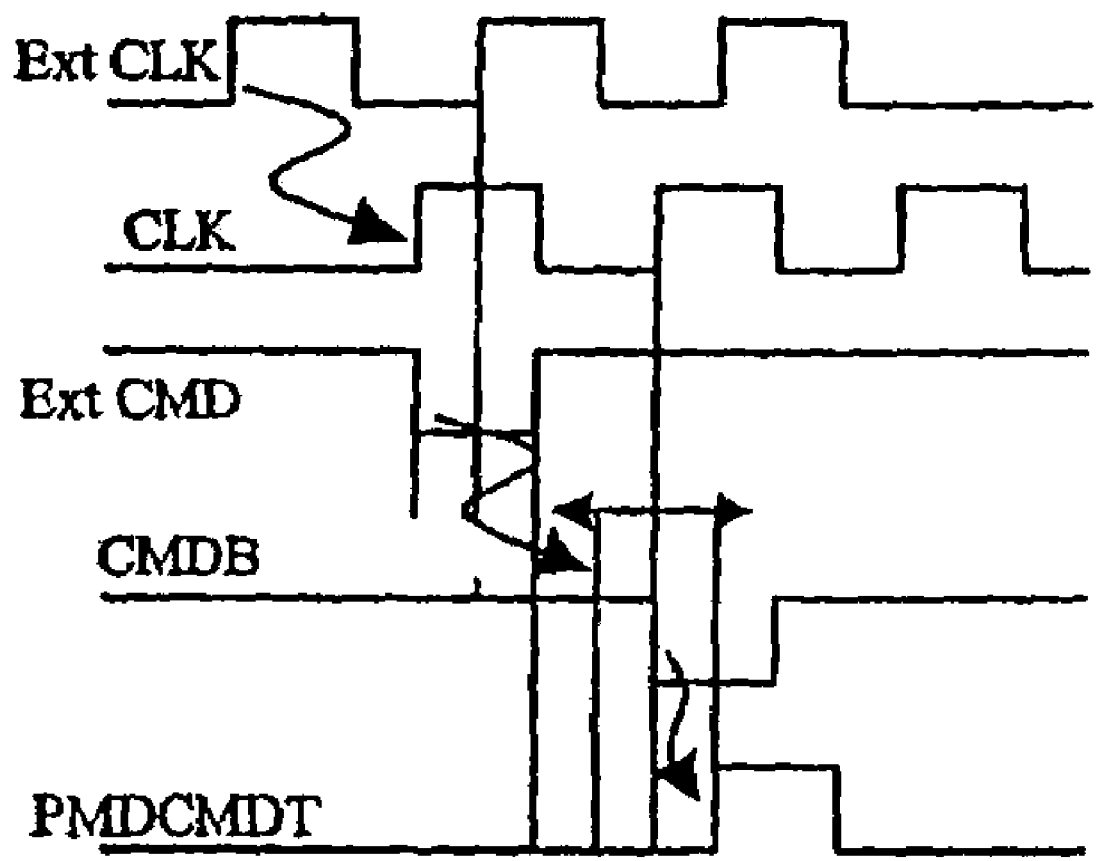
FIG. 3 is a timing chart representing the operation of a latch circuit shown in FIG. 2.
Figure 4:
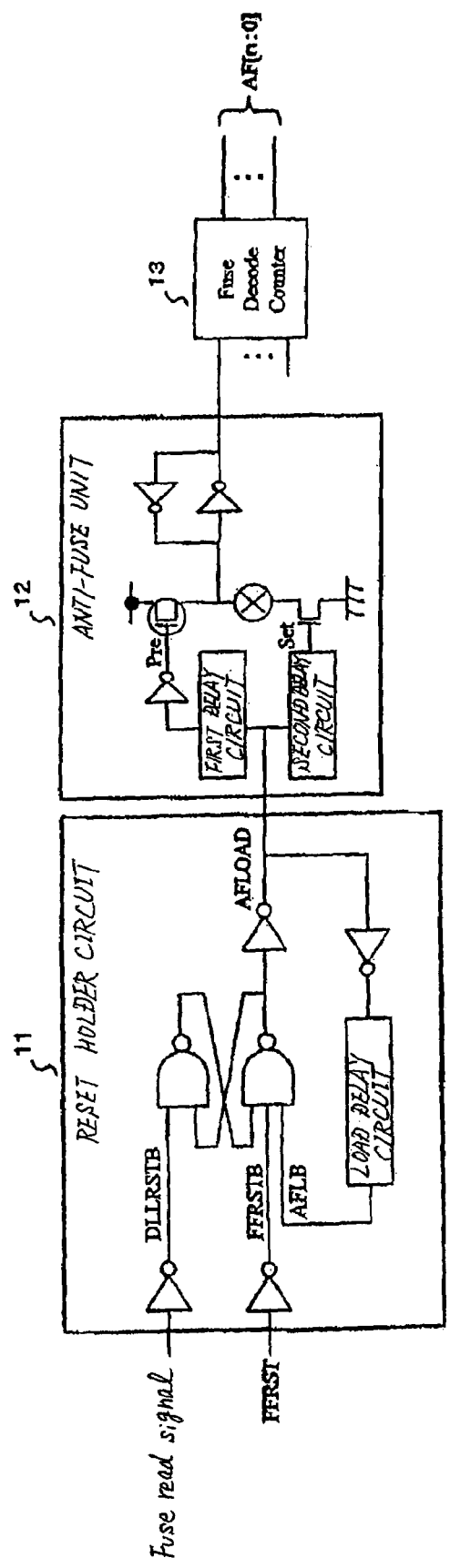
FIG. 4 is a circuit diagram illustrating an exemplary configuration of an anti-fuse block shown in FIG. 2.
Figure 5:
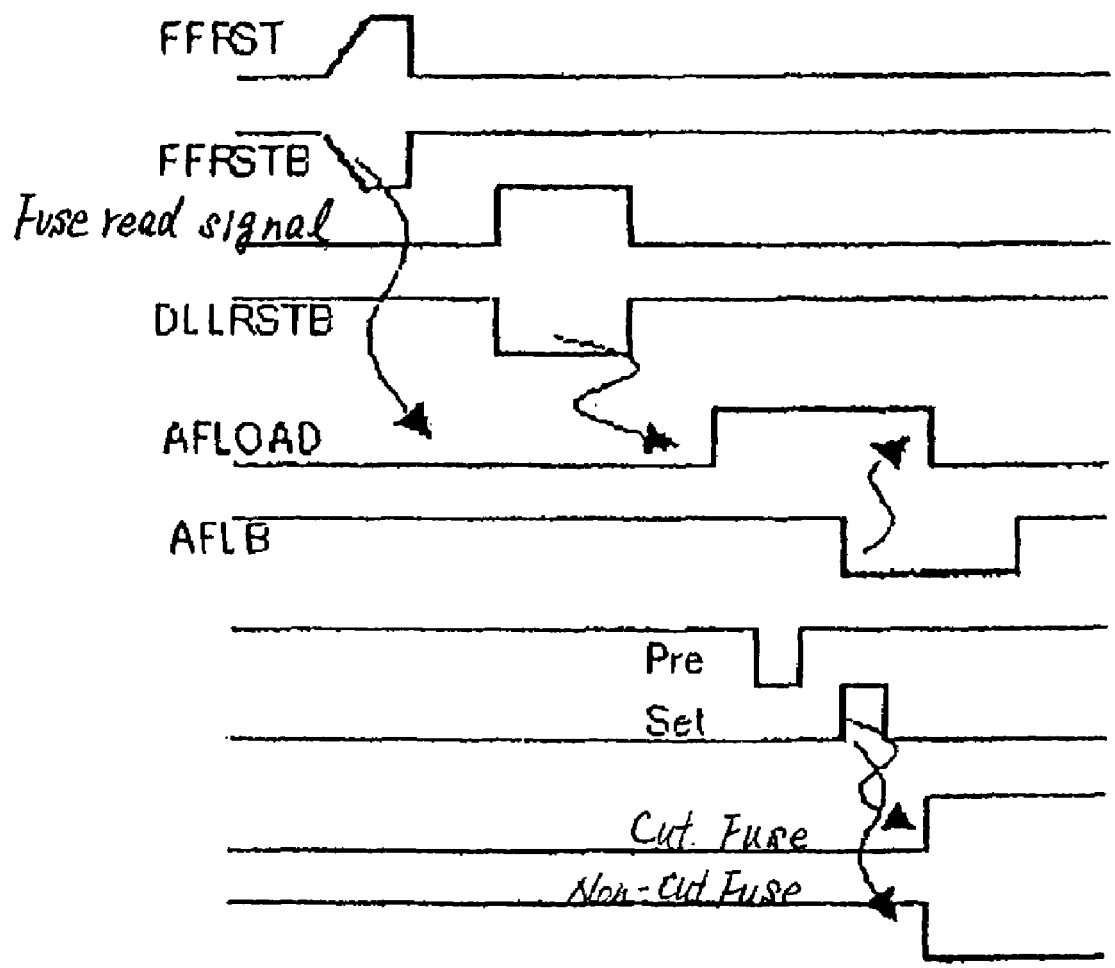
FIG. 5 is a timing chart representing the operation of the anti-fuse block illustrated in FIG. 4.
Figure 6:
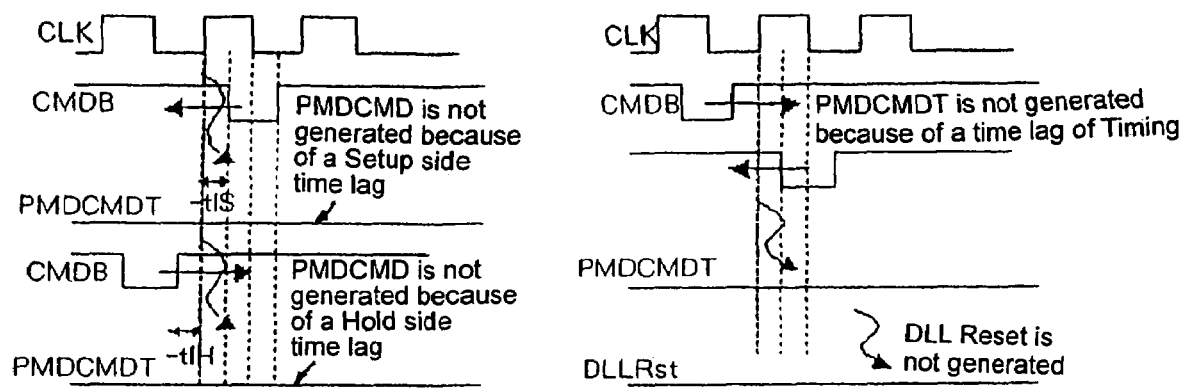
FIG. 6 is a timing chart representing an exemplary defective operation of a latch circuit included in the conventional anti-fuse control circuit.
Figure 7:
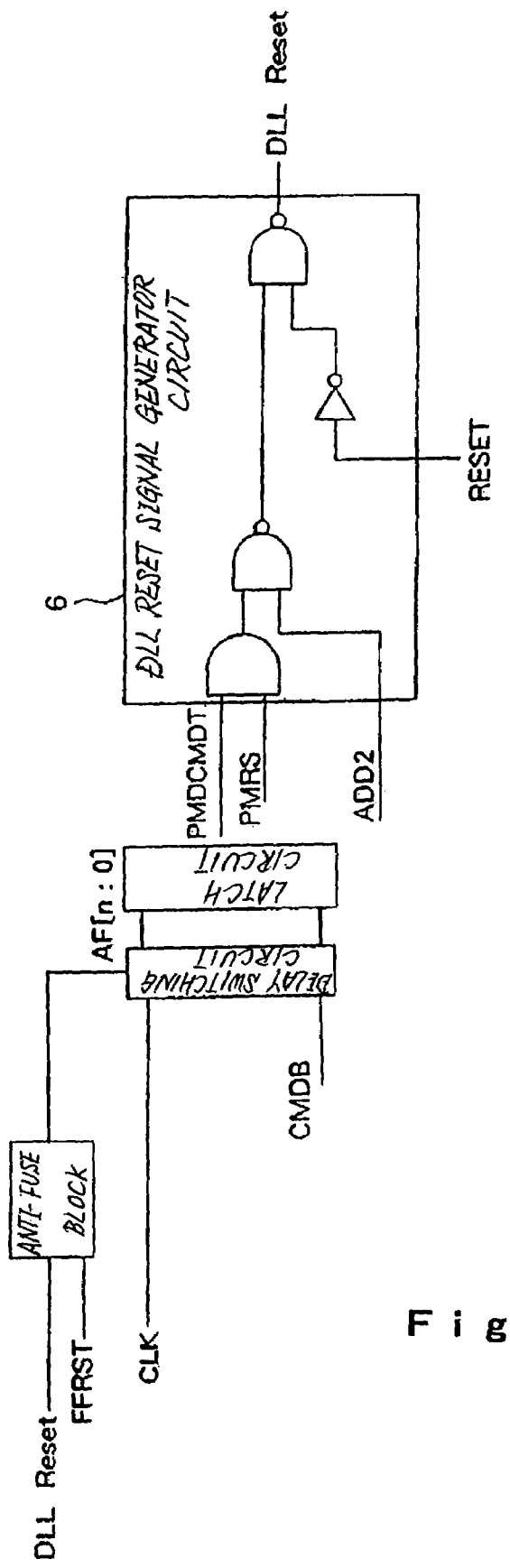
FIG. 7 is a circuit diagram illustrating an exemplary configuration of an anti-fuse control circuit according to the present invention.

As illustrated in FIG. 7, an anti-fuse control circuit according to the present invention differs from the conventional anti-fuse control circuit illustrated in FIG. 1 in that a DLL reset signal generator circuit is substituted for Fuse read signal generator circuit 5. Since the remaining configuration and operation of the present invention are basically similar to the conventional anti-fuse control circuit, a description thereon is omitted.

As illustrated in FIG. 7, DLL reset signal generator circuit 6 included in the anti-fuse control circuit according to the present invention generates a DLL Reset signal based on a PMDCMDT signal supplied from a latch circuit, in a manner similar to conventional read signal generator circuit 5. In this event, DLL reset signal generator circuit 6 receives instructions, in accordance with the values of a PMRS signal and an ADD2 signal which are code signals, whether or not to deliver the DLL Reset signal.

Further, DLL reset signal generator circuit 6 included in the anti-fuse control circuit of the present invention also generates and delivers the DLL Reset signal even when it is applied with a RESET signal asynchronous to clock CLK, which is supplied from the outside during the period (initial setting period) from powering on a system to the generation of an MRS CMD signal, as employed in DDR3-SDRAM.

Figure 8:
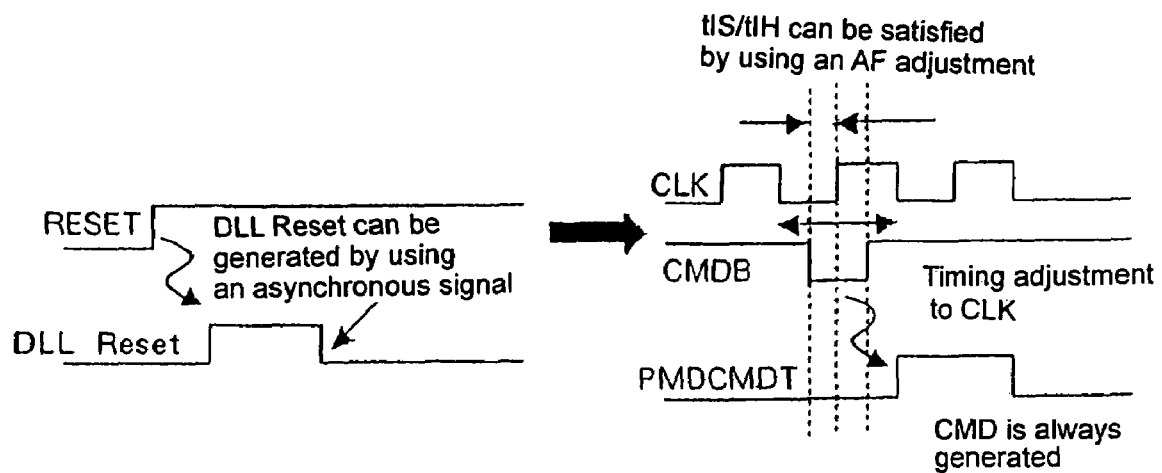
FIG. 8 is a timing chart representing the operation of a latch circuit included in the anti-fuse control circuit according to the present invention.

By thus generating a DLL Reset signal using the RESET signal asynchronous to clock CLK, a DLL Reset signal is always generated even at high clock frequencies, so that Fuse data is always delivered from an anti-fuse block. Consequently, as represented in FIG. 8, the delay amount of the CMDB signal can always be switched to a desired value in accordance with the Fuse data, thus ensuring that the PMDCMDT signal is delivered from the latch circuit.

Figure 9:
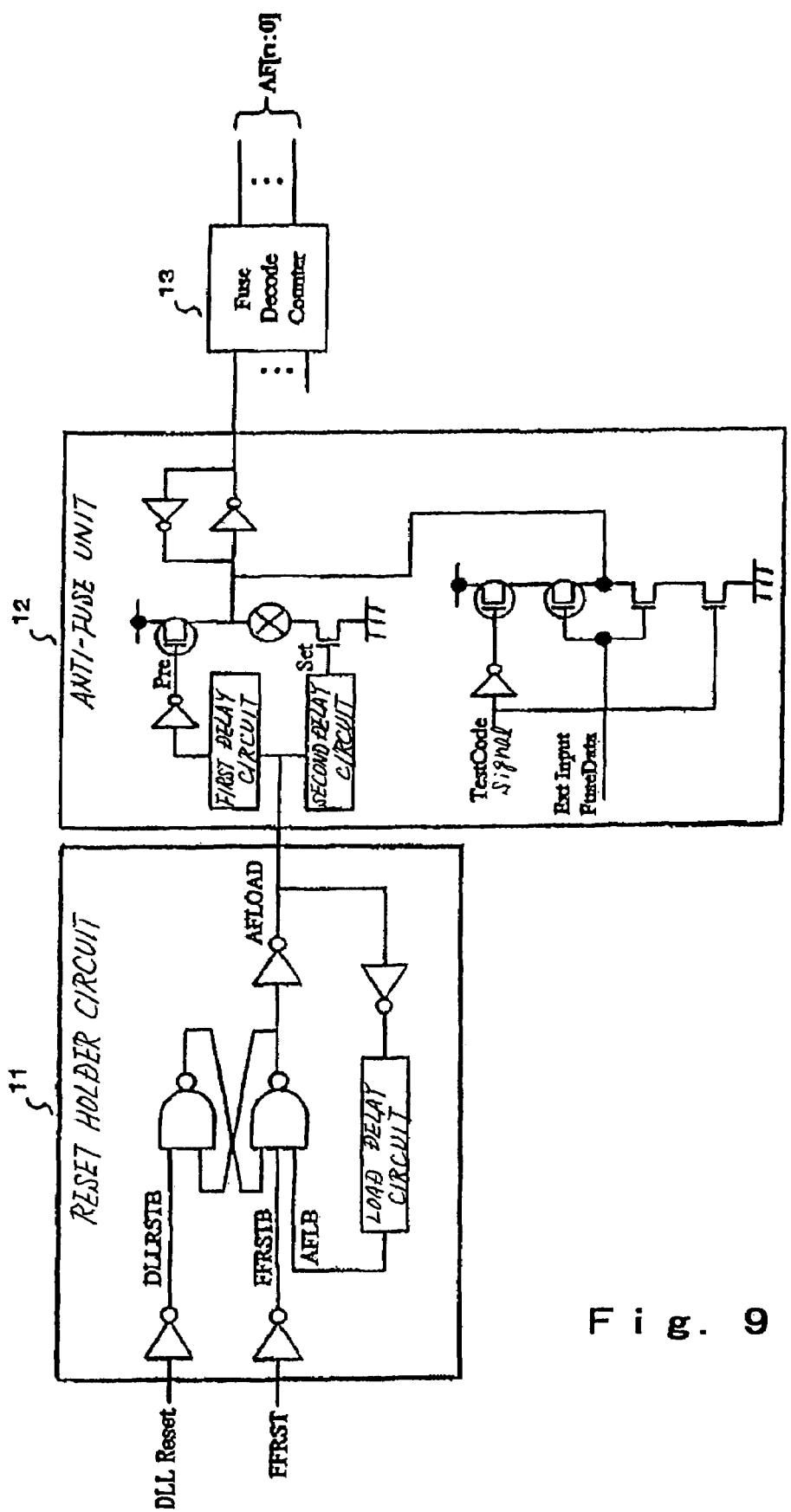
FIG. 9 is a circuit diagram illustrating an exemplary configuration of an anti-fuse block shown in FIG. 7.

A method of adjusting the delay amount will be described with reference to FIG. 9. FIG. 9 illustrates an exemplary circuit of the anti-fuse block shown in FIG. 7.

Anti-fuse unit 12 shown in FIG. 9 comprises a Clked inverter which operates in response to a TestCode signal, and "1"/"0" is set in each storage element of anti-fuse unit 12 to virtually latch arbitrary data in the storage element, thus making it possible to set the adjusting P-channel MOS transistor and adjusting N-channel MOS transistor, shown in FIG. 1, to ON/OFF without cutting the associated anti-fuses.

The delay amount can be changed by thus entering the amount of adjustment using the TestCode signal. The setting may involve entering AF[*] using the TestCode signal under a low speed condition where a relatively low value is required for tIS/tIH, latching AF[*] in a circuit, confirming the operation under a high speed condition similar to actual use, and adjusting the delay amount to find a state that operates under high speed condition.

It is therefore possible to always conduct, an adjustment test for writing Fuse data into anti-fuses (for adjusting the timing of an internal signal), after assembly of the semiconductor.

Also, in future semiconductor memory devices which are expected to operate at increasingly higher clock frequencies, since Fuse data written into the anti-fuse block is always delivered. Therefore, it is possible to obtain a semiconductor memory device that meets a specified value of tIS/tIH of the internal signal to the clock. Consequently, the manufacturing yield rate of semiconductor memory devices is improved.

In the present invention, where a semiconductor memory device is given as an example, the DLL-Reset signal can be generated from both the PMRS signal and reset signal asynchronous to clock CLK, so that the delay amount within its internal circuit will always be adjusted. It can be readily known to a person skilled in the art that the adjustment of the delay amount within the internal circuit, by reading the Fuse data using the reset signal, can be applied not only to semiconductor memory devices but also to more general semiconductor devices.

An example of performing initial settings using the RESET signal may be power-on-reset of CPU. However, the CPU reads a program stored in ROM or the like in response to a START signal called a reset signal to execute an operation of reading data required for initial settings of peripheral devices. In other words, the CPU does not use the reset signal for adjusting the timing within the semiconductor device, as it does in the present invention.

While a preferred embodiment of the present invention has been described using specific terms, such description is for illustrative purposes only, and it is to be understood that changes and variations may be made without departing from the spirit or scope of the following claims.

What is claimed is:

1. A semiconductor memory device comprising:
   an anti-fuse block having a plurality of anti-fuses for writing thereinto data required to adjust a timing of an internal signal generated when an initial setting is made;
   a delay amount switching circuit for delaying the internal signal by a desired delay amount in accordance with the data;
   a latch circuit for generating a command required to read the data from said anti-fuse block based on the internal signal delivered from said delay amount switching circuit after the delay; and
   a DLL reset signal generating circuit for supplying said anti-fuse block with a DLL reset signal generated by using the command signal and a reset signal supplied asynchronously to a clock for causing said anti-fuse block to deliver the data.

2. The device according to claim 1, wherein the DLL reset signal generating circuit is adapted to generate the DLL reset signal based on a PMDCMDT signal supplied from the latch circuit.

3. The device according to claim 1, wherein the DLL reset signal generating circuit is adapted to receive instructions in accordance with values of a PMRS signal and an ADD2 signal which are code signals.

4. The device according to claim 1, wherein the DLL reset signal generating circuit is adapted to deliver the DLL reset signal when applied with a reset signal asynchronous to clock CLK, which is supplied from outside during a period of powering on a system generating a MRS CMD signal employed in a DDR3-SDRAM.

5. A method of adjusting a semiconductor memory device for adjusting a timing of an internal signal by using data written into anti-fuses when an initial setting is made, said method comprising the steps of:
  asynchronously generating a DLL Reset signal for delivering the data from said anti-fuses by using a reset signal supplied asynchronously to a clock; and
  supplying the DLL Reset signal to an anti-fuse block including a plurality of anti-fuses which have data written therein required for adjusting the timing of the internal signal.

6. The method according to claim 5, wherein the DLL reset signal is generated based on a PMDCMDT signal supplied from a latch circuit.

7. The method according to claim 5, wherein the DLL reset signal is generated using a DLL reset signal generating circuit adapted to generate the DLL reset signal based on a PMDCMDT signal supplied from a latch circuit.

8. The method according to claim 5, wherein the DLL reset signal is generated using a DLL reset signal generating circuit adapted to deliver the DLL reset signal when applied with a reset signal asynchronous to clock CLK, which is supplied from outside during a period of powering on a system generating a MRS CMD signal employed in a DDR3-SDRAM.

9. A method of adjusting a semiconductor device for adjusting the timing of an internal signal by using data written into anti-fuses when an initial setting is made, said method comprising the steps of:
  reading data written into the anti-fuses included in said semiconductor device by using a command signal generated within said semiconductor device, and a reset signal supplied asynchronously to a clock signal; and
  adjusting the timing of the internal signal in accordance with the data.

10. The method according to claim 9, wherein the reset signal is generated based on a PMDCMDT signal supplied from a latch circuit.

11. The method according to claim 9, wherein the reset signal is generated using a DLL reset signal generating circuit adapted to generate the DLL reset signal based on a PMDC-MDT signal supplied from a latch circuit.

12. The method according to claim 9, wherein the reset signal is generated using a DLL reset signal generating circuit adapted to deliver the DLL reset signal when applied with a reset signal asynchronous to clock CLK, which is supplied from outside during a period of powering on a system generating a MRS CMD signal employed in a DDR3-SDRAM.

* * * * *